VARIABLE FREQUENCY OSCILLATOR

Filed May 15, 1961 5 Sheets-Sheet 1

INVENTOR.
PHILIP D. COREY
BY Isidore Match
ATTORNEY

INVENTOR.
PHILIP D. COREY
BY Isidore Match
ATTORNEY

INVENTOR.
PHILIP D. COREY
BY Isidore Match
ATTORNEY

INVENTOR.
PHILIP D. COREY
BY
Isidore Match
ATTORNEY

Nov. 9, 1965 P. D. COREY 3,217,171

VARIABLE FREQUENCY OSCILLATOR

Filed May 15, 1961 5 Sheets-Sheet 5

INVENTOR.
PHILIP D. COREY

BY Isidore Match

ATTORNEY

United States Patent Office 3,217,171
Patented Nov. 9, 1965

3,217,171
VARIABLE FREQUENCY OSCILLATOR

Philip D. Corey, Waynesboro, Va., assignor to General Electric Company, a corporation of New York Filed May 15, 1961, Ser. No. 109,889
18 Claims. (Cl. 307—57)

This invention relates to oscillators. More particularly, it relates to multivibrators wherein the frequency may be controlled in accordance with electrical signals applied thereto.

In many situations where oscillators are utilized, it is necessary to maintain a constant frequency output therefrom. In certain applications, however, it is desirable to control the frequency of the oscillator output in accordance with an electrical signal applied thereto. An example of the latter applications may be where it is desired to synchronize the frequency of a multivibrator with a power source in response to an electrical control signal. Another example of such applications may be where the output of a multivibrator drives an induction motor and it is desired to control the speed of the motor.

It is, accordingly, an important object of this invention to provide a multivibrator oscillator which has a variable frequency over a wide range, such frequency being controllable by low power electrical signals.

It is another object of the invention to provide a multivibrator oscillator in accordance with the preceding object wherein there is produced substantially constant amplitude output voltage over the entire frequency range.

It is a further object of the invention to provide a multivibrator oscillator in accordance with the preceding objects which is flexible in that the control signals are isolated from the multivibrator oscillator whereby such control signals are utilizable at practically any impedance level.

A feature of this invention resides in the combination of a magnetic coupled multivibrator and a saturable reactor, the control winding of the latter having applied thereto the control signal whereby the frequency of the multivibrator is a function of the amplitude of the control signal.

Another feature of this invention resides in the use of a plurality of control windings whereby the multivibrator frequency is made proportional to the algebraic sums of a plurality of input signals. Thus, a bias signal may be applied to one control winding so that the multivibrator frequency may be set at some initial point in the center of its design range and then signals can be applied to a second winding to vary the frequency of oscillation above and below such initial point.

Generally speaking, and in accordance with the invention, there is provided the combination of a magnetic coupled multivibrator, an electrical signal source and means responsive to the application thereto of the signal from such source for switching the multivibrator from one to the other state at a rate determined by the amplitude of the signal.

The features of this invention which are believed to be new are set forth with particularity in the appended claims. The invention itself, however, may best be understood by reference to the following description when taken in conjunction with the accompanying drawings which show embodiments of a multivibrator according to the invention.

In the drawings, FIG. 1 is a schematic depiction of an embodiment according to the invention;

Figure 1:
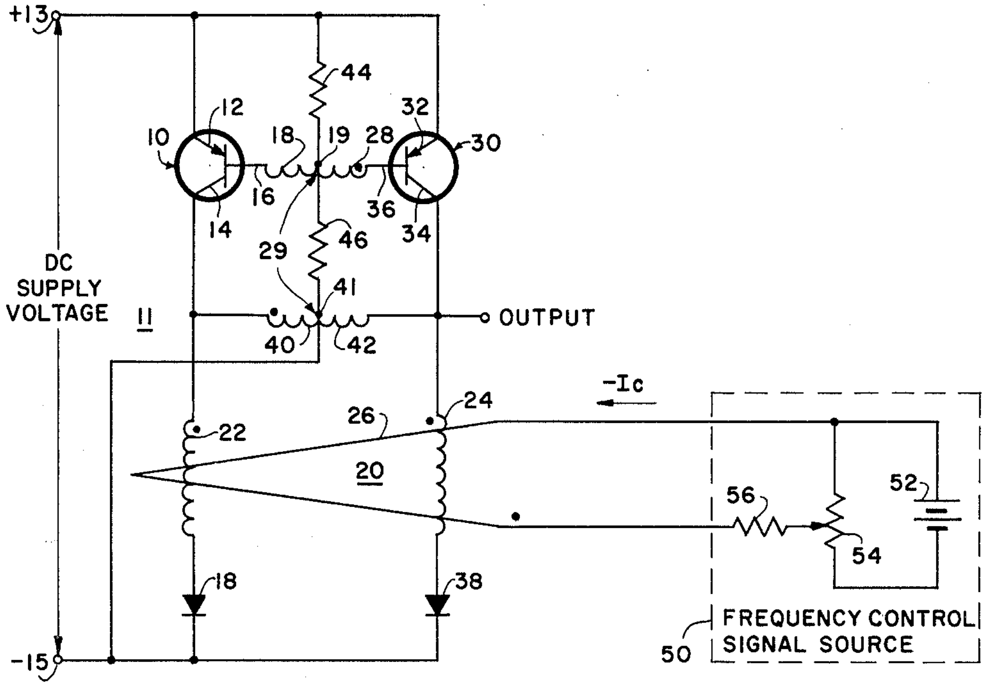

Referring now to FIG. 1, a transistor 10 has its emitter 12 connected to the positive terminal 13 of a unidirectional potential supply source 11 and its collector 14 connected to the negative terminal 15 of source 11 through the series arrangement of one gate winding 22 of a twin-cored saturable reactor 20 and the anode to cathode path of a diode 18.

A transistor 30 has its emitter 32 connected to positive terminal 13 and its collector 34 connected to negative terminal 15 through the series arrangement of the other gate winding 24 of saturable reactor 20 and the anode to cathode path of a diode 38.

The base 16 of transistor 10 and the base 36 of transistor 30 are interconnected by secondary windings 18 and 28 of a transformer, dots designating polarity being shown thereon. Collectors 14 and 34 are interconnected by the primary windings 40 and 42 of transformer 29, dots designating polarity also being shown thereon. A resistor 44 is interposed between the junction 19 of windings 18 and 28 and positive terminal 13 and a resistor 46 is also connected between the junction 41 of windings 40 and 42 and junction 19, junction 41 being connected to negative terminal 15.

The arrangement including only transistors 10 and 30, secondary windings 18 and 28, primary windings 40 and 42, and resistors 44 and 46 is a magnetic coupled multivibrator provided that transformer 29 is a saturable transformer having a core with a relatively square hysteresis loop characteristic. The latter type multivibrator has a constant volt-second characteristic such that when constant voltage is applied thereto, a constant frequency output is produced therefrom. Stating this in another manner, the frequency of oscillation of the multivibrator is proportional to the input D.C voltage applied thereto, the constant of proportionality depending upon the volt-second characteristic of the transformer.

In the operation of such multivibrator, transistors 10 and 30 alternately apply the voltage from source 11 to primary windings 40 and 42 of transformer 29. Upon the application of such supply voltage, the voltage divider comprising resistors 44 and 46 biases the base to emitter junctions of both transistors in such a direction as to render them both conductive. However, any small unbalance causes one transistor to become conductive before the other. If it is assumed that transistor 10 is rendered conductive first, the polarity of winding 18 is such that when transistor 10 so conducts, the positive voltage applied at the polarity dot terminal of winding 18 induces a negative voltage at base 16 with respect to junction 19 thereby increasing the conductivity in transistor 10 and holding it conductive until the transformer saturates. While transistor 10 is biased in the conductive direction, it is to be noted that the reverse polarity occurring in winding 28 is biasing transistor 30 further in the nonconductive direction.

When transformer 29 saturates after transistor 10 has been conductive, the base drive on transistor 10 collapses and transistor 30 is substantially immediately rendered conductive. In this manner, transistor 30 supplies the other half cycle of the output of the multivibrator.

The saturable reactor functions to effect control of the frequency of oscillation of the multivibrator without affecting its output amplitude. In the situation where the saturable reactor is employed, transformer 29 is not necessarily of the saturable type. Gating windings 22 and 24 are of low resistance and thus when saturation of either core of saturable reactor 20 occurs, the action of the multivibrator is the same as if transformer 29 were a saturable transformer that had saturated. The period of oscillation of the multivibrator then becomes a function of the excitation time of the saturable reactor.

Such excitation time is controllable by a control signal from a frequency control signal source 50, such control signal being applied to a control winding 26 encompassing both cores of saturable reactor 20. Frequency control signal source 50 may suitably be a variable unidirectional potential comprising a D.C. source 52, a variable resistor 54 in shunt therewith, resistor 54 being connected in series arrangement with winding 26, winding 26 encompassing both cores of saturable reactor 20. The polarity dot designation on winding 26 indicates the direction of current flow therethrough to provide positive ampere turns therein.

Diodes 18 and 38 are included as in self-saturating magnetic amplifiers, i.e., "amplistats" to improve the control characteristic of the saturable reactor, i.e., to achieve "amplistat gain" of the circuit. If diodes 18 and 38 were omitted, the circuit would function as desired but the sensitivity of the frequency versus control ampere-turns characteristic would be reduced.

In the operation of the total circuit of FIG. 1, i.e., with transformer 29 being of the non-saturable type, transformer 29 functions merely to provide transformer action, not commutating action, the commutating action occurring only when a gate winding 22 or 24 of saturable reactor 20 saturates. With this arrangement, the voltage applied to the primary windings 40 and 42 of transformer 29 is essentially determined by the amplitude of the D.C. supply voltage from source 11, due to the switching action of transistors 10 and 30. The output of the circuit can be taken from a secondary winding (not shown) in transformer relationship with primary windings 40 and 42.

Thus with the arrangement of FIG. 1, there is enabled the producing of a variable frequency output with a relatively constant amplitude over a wide frequency range, such range being determined by the amplitude of the frequency control signal through winding 26. The supply voltage is maintained at a constant value. By contrast, if it were desired to vary the frequency of a device wherein no saturable reactor were utilized and wherein transformer 29 were of the saturable type, then the frequency of the output thereof could only be varied by either changing the value of supply voltage 11 or replacing transformer 29 with a saturable transformer having a different volt-seconds characteristic. In the former situation, the amplitude of the output would have to change due to the change of value of the supply voltage. The inconvenience and other disadvantages presented by the having to replace transformer 29 with a transformer having a different volt-seconds characteristic is readily appreciated.

Accordingly, with the arrangement of FIG. 1, there is provided a magnetic coupled multivibrator wherein a substantially constant amplitude output over a wide frequency range is provided with the use of small power currents provided by the frequency control signal.

Figure 2:
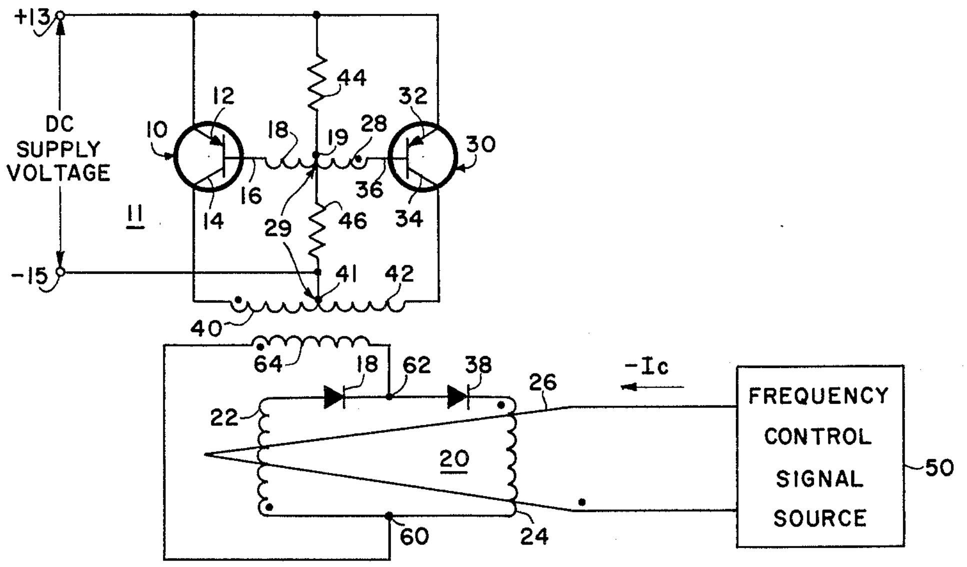
FIG. 2 is a depiction of a second embodiment according to the invention.

In FIG. 2, the multivibrator is the same as that shown in FIG. 1 and accordingly the same numerals are utilized to designate like structures. In the arrangements of these figures, the polarity dot terminal of one gate winding 22 of the saturable reactor 20 is connected to the non-polarity dot terminal of the other gate winding 24 of reactor 20 at junction 60 and the non-polarity dot terminal of gate winding 22 is connected to the polarity dot terminal of gate winding 24 through the series arrangement of the anode to cathode paths respectively of diodes 18 and 38, a secondary winding 64 of transformer 29 being connected between junction 60 and the junction 62 of the cathode of diode 18 and the anode of diode 38. Control winding 26 of saturable reactor 20 encompasses both of the cores thereof.

The circuit of FIG. 2 functions substantially in the same manner as that of FIG. 1 except that the signal applied to the gate windings of saturable reactor 20 is obtained through the respective collectors of transistors 10 and 30 and through transformer action between windings 40 and 42 and winding 64. Diodes 18 and 38 function as in the circuit of FIG. 1 to enable the achieving of "amplistat gain."

In the operation of the circuit of FIG. 2, if it is assumed that transistor 10 is the first to conduct, transformer action between primary windings 40 and 42 and secondary winding 64 provides the current flowing through transistor 10 and transformer 29 to gate winding 22. When gate winding 22 saturates, because of transformer action, the junction of winding 40 and collector 14 goes sharply in the negative direction and transistor 30 is rapidly triggered into conduction. The same events now ensue with transistor 30 and gate winding 24 to provide the other half of the output cycle. Here again, the amplitude of the output voltage is determined essentially by the value of the D.C. voltage from source 11 and is independent of the strength of the signal in control winding 26. The output of the circuit may be taken from a secondary winding (not shown) as in the circuit of FIG. 1.

Figure 3:
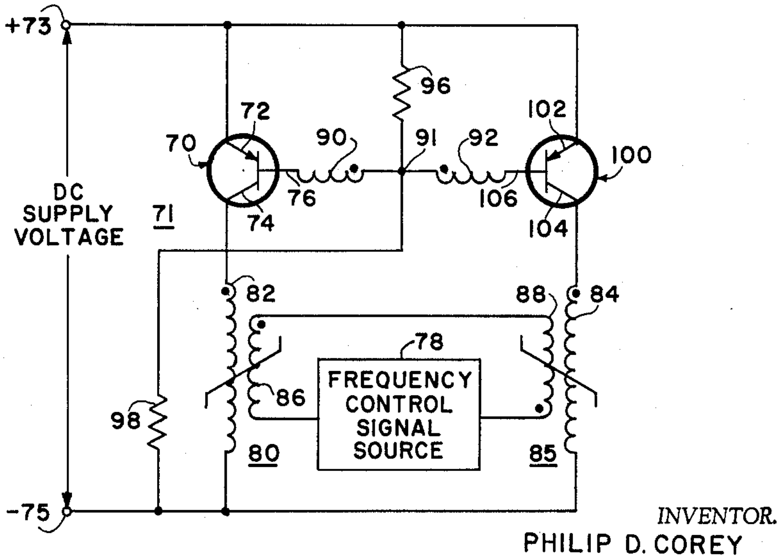
FIG. 3 is a depiction of a third embodiment according to the invention.

In FIG. 3, the multivibrator comprises a transistor 70 which has its emitter 72 connected to the positive terminal 73 of unidirectional potential source 71 and its collector 74 connected to the negative terminal 75 of source 71 through a primary winding 82 of a saturable transformer 80. Its base 76 is connected to positive terminal 73 through a secondary winding 90 of transformer 80 and a resistor 96.

A transistor 100 has its emitter 102 connected to positive terminal 73 and its collector 104 connected to negative terminal 75 through a primary winding 84 of saturable transformer 85. Its base 106 is connected to the positive terminal 73 of source 71 through a secondary winding 92 of transformer 85 and resistor 96. The junction 91 of windings 90 and 92 is connected to negative terminal 75 through a resistor 98. The frequency control signal source 78 is connected in series arrangement with a secondary winding 86 of transformer 80 and a secondary winding 88 of transformer 85.

In the operation of the circuit of FIG. 3, secondary winding 90 of transformer 80, as indicated by the location of the polarity dot thereon, maintains transistor 70 conductive in the event that transistor 70 is first to conduct. Secondary winding 86 of transformer 80 is connected in series with frequency control signal source 78 and secondary winding 88 of transformer 85 in such polarity as indicated by the polarity dots that the sum of the voltages from winding 86 and from source 78 serves to reset the core of transformer 85 and to generate a bias signal to render transistor 100 non-conductive. This condition persists until the core of transformer 80 saturates, at which time, transistor 70 is substantially immediately rendered non-conductive due to the sharp rise in potential at base 76 and transistor 100 is rendered conductive whereby the next half-cycle of oscillation of the multivibrator is initiated. The periodic resetting of the cores of transformers 80 and 85 and, accordingly, the frequency of oscillation of the multivibrator is controlled by the amplitude of the signal from frequency control signal source 78. The circuit of FIG. 3 is an example of an arrangement in accordance with the invention wherein the output frequency is controlled by the use of saturable transformers rather than by a saturable reactor. The outputs of the circuit can be taken from secondary windings (not shown) of transformers 80 and 85 respectively.

Figure 4:
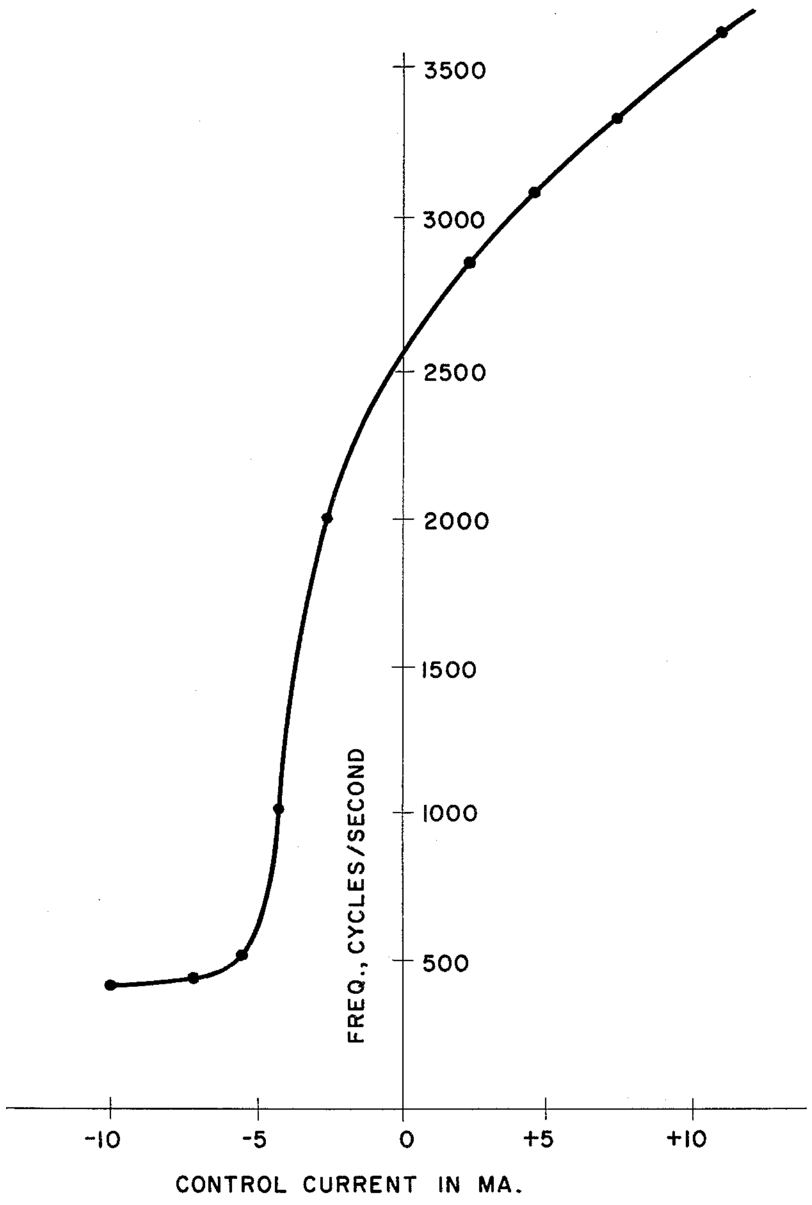
FIG. 4 is a graph of the control characteristic of the circuit of FIG. 1.

In FIG. 4, there is shown a graph of the frequency versus control current of the circuit of FIG. 1. In this graph, the abscissa is current through control winding 26 in milliamperes and the ordinate is the frequency of oscillation of the multivibrator in cycles per second. From a control current of −5.5 in the positive direction, the high gain of the circuit is readily appreciated.

Figure 5:
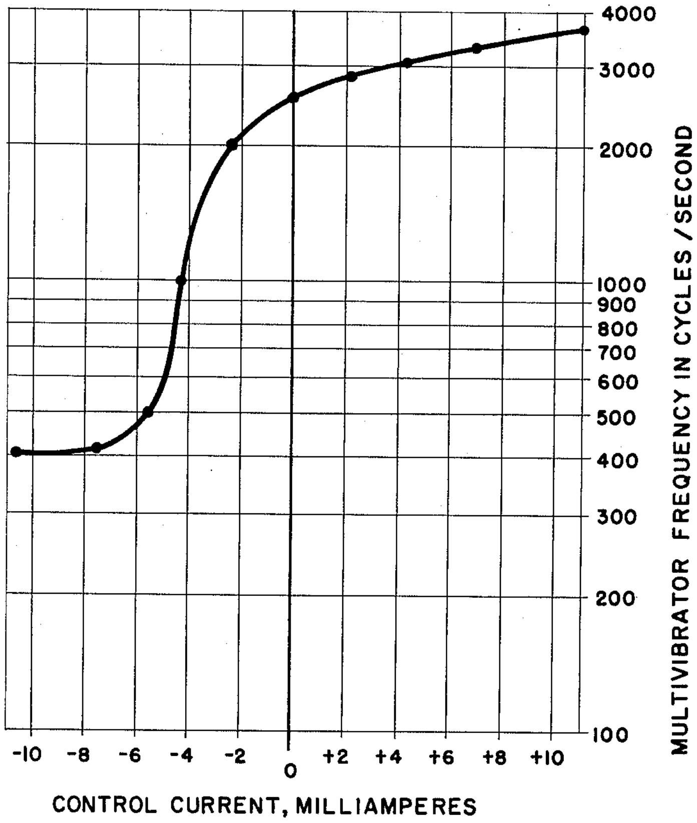
FIG. 5 is another graph of the control characteristic of the circuit of FIG. 1.

FIG. 5 depicts a graph similar to that of FIG. 4 except that the ordinate is logarithmic to enable the making of the transfer characteristic of the circuit of FIG. 1 more closely resemble that of the so called "amplistat."

Figure 6:
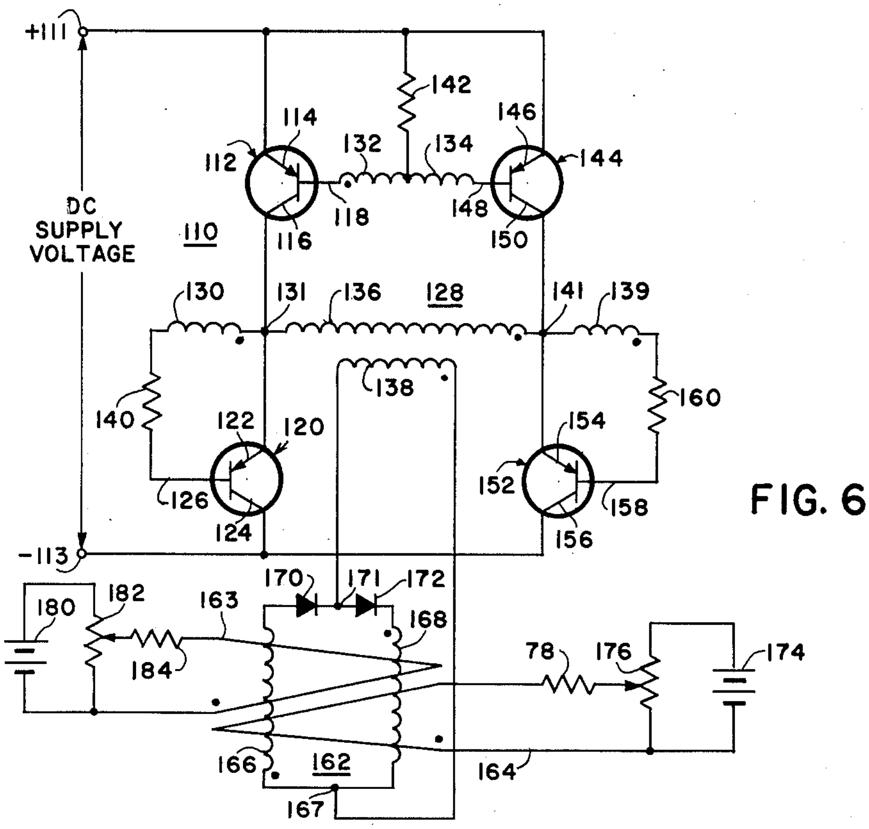
FIG. 6 is a schematic drawing of a fourth embodiment of the invention.

In FIG. 6, a transistor 112 has its emitter 114 directly connected to the positive terminal 111 of a D.C. supply voltage source 110 and its collector 116 connected to the base 126 of a transistor 120 through a secondary winding 130 of a transformer 128 and a resistor 140 and directly connected to emitter 122. The base 118 of transistor 112 is connected to positive terminal 111 through a secondary winding 132 of transformer 128 and a resistor 142.

The emitter 122 of transistor 120 is connected to collector 116 of transistor 112 through the junction 131 of secondary winding 130 and primary winding 136 of transformer 128. The collector 124 of transistor 120 is directly connected to the negative terminal 113 of source 110.

A transistor 144 has its emitter 146 directly connected to terminal 111, its collector 150 directly connected to the emitter 154 of a transistor 152 through the junction 141 of a secondary winding 139 and primary winding 136 of transformer 128 and connected to the base 158 of transistor 152 through secondary winding 139 and a resistor 160.

A saturable reactor 162 having twin cores and a given volt-seconds characteristic comprises a control winding 163 and a control winding 164 which encompass both cores. Saturable reactor 162 also comprises gate windings 166 and 168, the respective terminals of windings 166 and 168 at one end being joined at junction 167, the other terminals of windings 166 and 168 being connected to each other through the series arrangement of the diodes 170 and 172. The polarity dot terminal of secondary winding 138 of transformer 128 is connected to junction 167 and the other terminal of winding 138 is connected to the junction 171 of diodes 170 and 172, diodes 170 and 172 being included to provide amplistat gain as previously explained hereinabove.

A control signal for winding 164 is provided from a D.C. potential source 174, a portion of a variable resistor 176 and a resistor 178. A control signal for winding 163 is provided from a D.C. potential source 180, a portion of variable resistor 182 and a resistor 184. The designating polarity dots on windings 163 and 164 indicate the direction of current flow therethrough to provide positive ampere turns therein. The designating polarity dots on gate windings 166 and 168 also indicate the direction of current flow therethrough to provide positive ampere turns therein. It is seen that control windings 163 and 164 are so poled as to effect orientation of the flux in the cores of saturable reactor 162 in opposite directions whereby the net influence on the direction of the flux in these cores is determined by the algebraic sum of the control signals in windings 163 and 164.

The operation of the circuit of FIG. 6 is similar to the operation of the circuit of FIG. 2. The use of four transistors enables operation from higher D.C. supply voltages. In such operation, when the supply voltage is applied to the circuit, any unbalance will cause either transistors 112 and 154 or transistors 144 and 120 to first conduct concurrently, such conduction providing current to one or the other of gate windings 166 and 168 of saturable reactor 162 through transformer action between primary winding 136 and secondary winding 138 and depending upon which pair of transistors is conducting at the time. When saturation occurs, the transistors conducting at that time are rapidly rendered non-conductive and the other pair of transistors are quickly rendered conductive. With the use of a plurality of control windings such as the two control windings 163 and 164 of saturable reactor 162, the frequency of the multivibrator of FIG. 6 may be made proportional to the algebraic sum of such plurality of input signals. The polarity dot designations on the saturable reactor windings shown in FIG. 6 indicate that the signals in control windings 163 and 164 thereof are in bucking relationship. Of course the arrangement of the control windings may be chosen to supplement, i.e., reinforce each other, or buck each other. Thus, a bias signal may be applied to one of the control windings so that the multivibrator frequency is set at some initial point such as the middle of its design range. Signals may then be applied to a second winding in such polarity and such magnitude as to vary the frequency of oscillation above and below the quiescent level.

Figure 7:
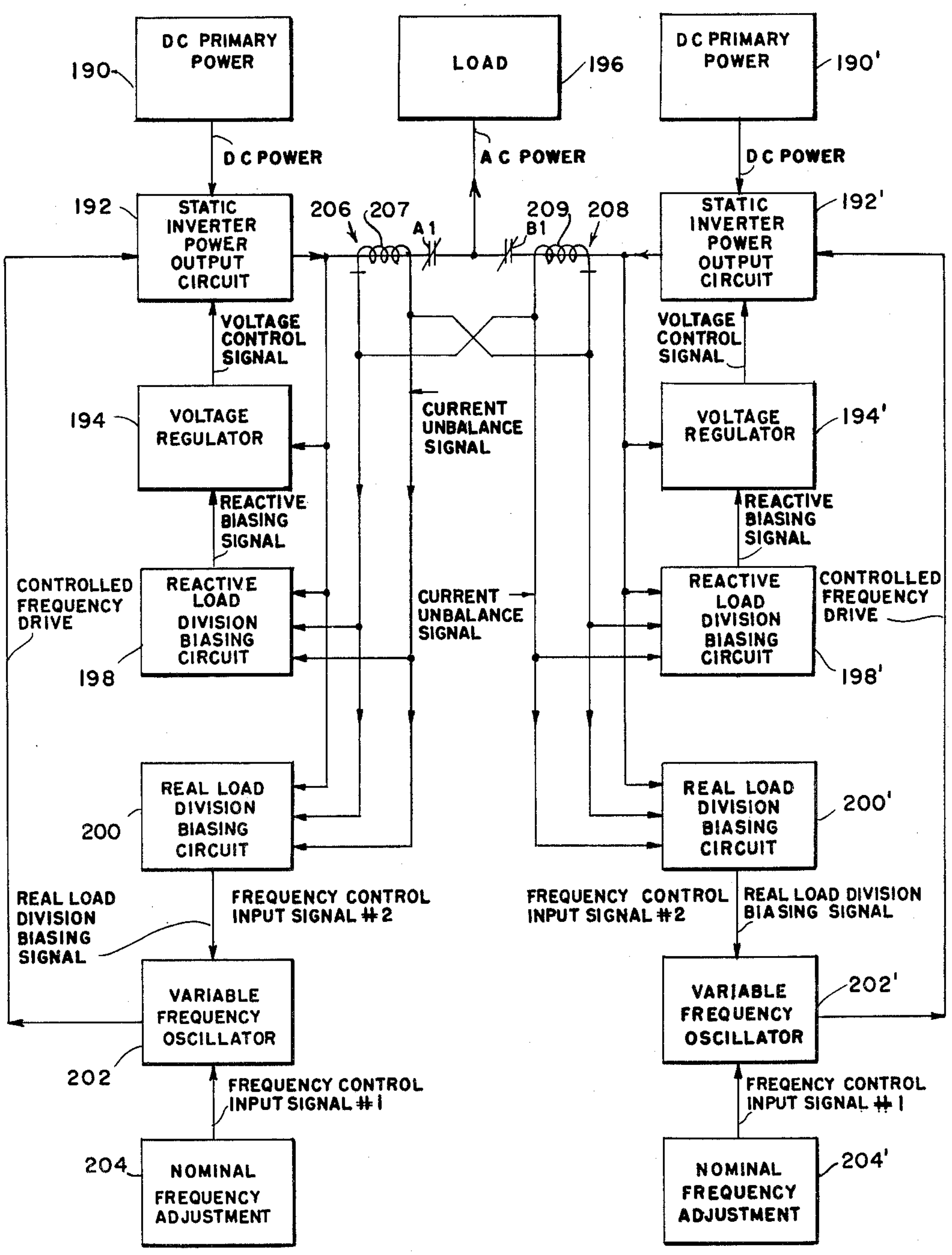
FIG. 7 is a diagram, essentially in block form of an arrangement for controlling load sharing in parallel electric power systems according to the principles of this invention.

In FIG. 7 wherein there is shown an application of the variable frequency oscillator of the invention to control load sharing in parallel electric power systems, these separate systems, for convenience, are shown to have the same corresponding elements. Accordingly, such corresponding elements are designated with the same numerals, the designating numerals for one of the systems including the prime notation.

The systems include D.C. power sources 190 and 190', the power of which is converted to A.C. power of a desired frequency in static inverters 192 and 192'. The voltage of the outputs of the inverters is regulated by suitable voltage regulators 194 and 194' such as the type containing a reference diode for deriving a reference voltage thereacross and a comparison circuit for producing an error voltage from the difference between the output voltage and the reference voltage. The A.C. output of the system is utilized to supply a load 196.

In parallel operation of two systems, it is necessary to obtain proper sharing of output load current. To enable such sharing, there has to be obtained a real load and a reactive load bias voltage. The reactive load division biasing signals are obtained in elements 198 and 198' such elements suitably respectively comprising phase discriminators as are generally used for such purpose and are well known in the art. The reactive load division biasing signals are provided to voltage regulators 194 and 194' as control signals.

The real load division biasing circuits 200 and 200' are similar to the phase discriminators used to obtain reactive load division biasing signals, the signals from elements 200 and 200' being applied to variable frequency oscillators 202 and 202' as control signals therefor.

Oscillators 202 and 202' are variable frequency oscillators in accordance with the invention as shown in the preceding figures, the outputs of the real load division biasing circuits being applied for example, to a control winding of a saturable reactor such as is utilized in the circuit of FIG. 6. It is to be realized that the multivibrators of the respective oscillators utilized in elements 202 and 202' may be either of the two transistor or four transistor type, etc., with the saturable reactor having a plurality of control windings.

Applied to another control winding of each of the saturable reactors in the variable frequency oscillators of elements 202 and 202' is the nominal frequency adjustment to set the frequencies of the oscillators. The nominal frequency adjustments 204 and 204' are circuits such as the frequency control signal sources shown in the preceding figures.

Considering the operation of the parallel system of FIG. 7, the outputs of static inverter power output circuits 192 and 192' are shown connected through normally closed contacts A1 and B1 which are associated with line contactor relays (not shown).

In current transformers 206 and 208, there are sensed the separate outputs of circuits 192 and 192' respectively. The secondary windings 207 and 209 of transformers 206 and 208 are cross-connected to enable generation of respective signals which are proportional in magnitude to the difference from the average of the output of each inverter. Such cross-connection enables the phase of the curent unbalance signal for each inverter to indicate whether a particular inverter is providing more or less than its share of the load current and thus enables generation of signals which permit the controlling of the outputs of the respective inverters whereby, consequently, each inverter provides only its proper share of the A.C. power to the electrical load.

In the system of FIG. 7, the A.C. outputs of the individual inverters are controlled by the variable frequency oscillators 202 and 202', i.e., variable frequency oscillators according to the invention and as specifically shown in FIG. 6. When an inverter is operated in an isolated or non-paralleled arrangement, the voltage of the output of each inverter is controlled by a voltage regulator, element 194 or 194' wherein there is sensed the voltage of the A.C. output of an inverter and after comparison with a voltage reference, a voltage control signal is generated and the latter signal is applied to the static inverter power circuit 192 or 192' to control the magnitude of the output voltage thereof. The frequency of the A.C. output is determined by the output of the variable frequency oscillator which provides driving signals to the power switching devices in the static inverter power output circuit. The frequency of the oscillator is set by means of the bias signal on a control winding as previously explained, such signal being obtained from a variable resistor connected to a D.C. voltage supply source, the variable resistor being set to obtain a desired A.C. output frequency.

In parallel operation of two inverters, if one of the inverters is providing more than its share of reactive load current (reactive load current is in quadrature with A.C. line voltage), a reactive biasing signal is generated in the corresponding reactive load biasing circuit, i.e., in element 198 or 198' and this generated signal is fed to the associated voltage regulator circuit in such manner as to effect a reduction in the output from the overloaded inverter until proper load sharing is achieved.

Similarly, if an inverter is supplying more than its share of real load (real load current is in phase with the A.C. line voltage), a real load biasing signal is generated by the real load biasing circuit 200 or 200' and this signal is applied to a second control winding in the associated variable frequency oscillator to effect the necessary reorientation of the relative phase angles of the static inverter power circuit outputs and proper load sharing is achieved. It is seen that the use of the variable frequency oscillator of this invention is particularly desirable and advantageous in a parallel arrangement of inverters such as depicted in FIG. 7 since the real load biasing signal is readily applied to a second isolated control winding or input of the variable frequency oscillator to bias its natural frequency in the increasing or decreasing direction as required to obtain the desired result.

While there have been shown particular embodiments of this invention, it will, of course, be understood that it is not wished to be limited thereto since different modifications may be made both in the circuit arrangements and in the instrumentalities employed and it is contemplated in the appended claims to cover any such modifications as fall within the true spirit and scope of the invention.

What is claimed as new and desired to be secured by Letters Patent of the United States is:

1. An oscillator comprising a plurality of devices, each being characterized by a conductive and a non-conductive state, means coupling said devices, an electric signal source, and means for switching a non-conductive one of said devices to the conductive state and a conductive one of said devices to the non-conductive state, said switching means including control means, said control means being operative in response to the application thereto of the signal from said source to selectively control said switching at a rate determined by the instantaneous amplitude of said applied signal voltage.

2. A magnetic coupled multivibrator comprising a plurality of devices, each of said devices being capable of being in a conductive and a non-conductive state, transformer means coupling said devices, an electric signal source, and means for effecting the switching through said transformer means of a non-conductive one of said devices to the conductive state and a conductive one of said devices to the non-conductive state, said switching means including control means, said control means being operative in response to the application thereto of the signal from said source to selectively control said switching at a rate determined by the instantaneous amplitude of said applied signal voltage.

3. A magnetic coupled multivibrator comprising a plurality of active devices, each of said devices being capable of being in a conductive and a non-conductive state to generate an alternating current, each of said devices including at least a control electrode and an output electrode, transformer means for alternating current coupling the output electrode of a first of said devices to the control electrode of a second of said devices, and for alternating current coupling the output electrode of said second device to the control electrode of said first device, an electrical signal source and means for changing the potential appearing at an electrode in one of said first and second devices, said alternating current coupling by said transformer means of the change in potential produced by said changing means consequently causing a conductive one of said first and second devices to be switched to the non-conductive state and the non-conductive one of said first and second devices to be switched to the conductive state, said changing means including control means, said control means being operative in response to the application thereto of the signal from said source to selectively effect said switching at a rate which is proportional to the amplitude of the voltage of the signal from said source.

4. A magnetic coupled multivibrator comprising a unidirectional potential source, a pair of active devices, each of said devices comprising at least an output electrode and a control electrode, transformer means for coupling the output electrodes of each device to the control electrodes of the other devices respectively, means for applying potential from said source to said devices to render one of said devices conductive and the other of said devices non-conductive, a saturable reactor comprising a control winding and a pair of gate windings, one of said windings being in circuit with the output electrode of one of said devices and said potential source, the other of said windings being in circuit with the output electrode of the other of said devices and said potential source, an electrical signal source, means for applying the signal from said source to said control winding, the saturation of said reactor resulting from said last-named application causing a sharp change in potential at the output electrode of said conductive device, the coupling of said change by said transformer means from said output electrode to the control electrode of the non-conductive device causing a switching of the states of said devices, said saturable reactor comprising a core having a given volt-second characteristic whereby the rate of said switching is controlled by the amplitude of the voltage of said signal, the output voltage of said multivibrator being substantially constant.

5. The magnetic coupled multivibrator defined in claim 4 wherein said active devices are transistors, said control electrodes and said output electrodes being the bases and collectors of said transistors respectively.

6. The magnetic coupled multivibrator defined in claim 4 and further including a pair of rectifiers, each of said rectifiers being in circuit with one of said gate windings respectively and said source.

7. A magnetic coupled multivibrator comprising a unidirectional potential source, a pair of active devices, each of said devices comprising at least an output electrode and a control electrode, a saturable reactor comprising a control winding and a pair of gate windings, transformer means for coupling the output electrodes of each device to the control electrodes of the other devices respectively and for coupling said output electrodes to said gate windings, means for applying potential from said source to said devices to render conductive one of said devices and to render non-conductive the other of said devices and for supplying the current flowing through said conductive device to the gate winding in circuit therewith, rectifying means in circuit with said gate windings to permit current flow through only one of said gate windings when a corresponding one of said devices is conductive, an electric signal source, means for applying the signal from said source to said control winding, the saturation of said reactor resulting from said last-named application causing a sharp change in potential at the output electrode of said conductive device to effect a switching of the state of said devices, said saturable reactor comprising a core having a given volt-second characteristic whereby the rate of said switching is controlled by the amplitude of the voltage of said signal, the output voltage of said amplifier being substantially constant.

8. A magnetic coupled multivibrator as defined in claim 7 wherein said active devices are transistors, said control electrodes and said output electrodes being the bases and collectors of said transistors respectively.

9. A magnetic coupled multivibrator comprising a unidirectional potential source, first and second active devices, each of said devices comprising at least an output electrode and a control electrode, first saturable transformer means having a plurality of windings for coupling the output and control electrodes of said first device, second transformer means having a plurality of windings for coupling the output and control electrodes of said second device, each of said transformers comprising a core having a given volt-second characteristic, means for applying potential from said source to said devices to render one of them conductive and the other of them non-conductive, an electrical signal source in circuit with windings of said transformers to couple the signal from said source and the signal present in the transformer in circuit with the conductive device to the other transformer in a polarity such that the sum of said signals orients the flux in the core of transformer in circuit with the non-conductive device in a direction opposite from the direction of flux in the core of the transformer in circuit with the non-conductive device, the saturation of the core of the transformer in circuit with the conductive device causing a change in the potential at the electrodes of the devices whereby the states of said devices are switched, the frequency of said switching being proportional to the amplitude of the voltage signal from said source, the output voltage of said multivibrator substantially being constant.

10. A magnetic coupled multivibrator as defined in claim 9 wherein said active devices are transistors, said control electrodes being the bases and collectors of said transistors respectively.

11. A magnetic coupled multivibrator comprising a unidirectional potential source, a pair of active switching means, each of said switch means including an active device comprising at least an output electrode and a control electrode, a saturable reactor comprising a plurality of control windings and a plurality of gate windings, transformer means for coupling the output electrodes of each device to the control electrodes of the other devices respectively and for coupling said output electrodes to first and second of said gate windings respectively, means for applying potential from said source to said devices to render conductive one of said switching means and to render non-conductive the other of said switching means and for supplying the current flowing through said conductive switching means to the gate winding in circuit therewith, a plurality of electrical signal sources, means for applying signals from said sources to said control windings respectively, the saturation of said reactor resulting from the application thereto of the algebraic sum of said control signals causing a sharp change in potential at the output electrode of a conductive device, to effect a switching of the states of said switching means, said saturable reactor comprising core means having a given volt-second characteristic whereby the rate of said switching is controlled by the amplitude of the voltage resulting from the algebraic sum of said signals, the output voltage of said amplifier being substantially constant.

12. The magnetic coupled multivibrator defined in claim 11 and further including rectifying means in circuit with said gate windings to permit current flow through only one of said gate windings when a corresponding one of said switching means is conductive.

13. The magnetic coupled multivibrator defined in claim 12 wherein said active devices are transistors, said control electrodes and said output electrodes being the bases and collectors of said transistors respectively.

14. In a parallel arrangement of a plurality of like systems for converting D.C. power to A.C. power, each of said combinations including power inverting means for producing said A.C. power at a chosen frequency in response to the application thereto of said D.C. power, oscillating means, means for applying the output of said oscillating means to said power inverter means to determine the output frequency of said power inverter means, said oscillating means comprising a magnetic coupled multivibrator comprising a unidirectional potential source, a pair of active devices, each of said devices comprising at least an output electrode and a control electrode, a saturable reactor comprising a plurality of control windings and a plurality of gate windings, transformer means for coupling the output electrodes of each device to the control electrodes of the other devices respectively and for coupling said output electrodes to first and second gate windings respectively, means for applying potential from said source to said devices to render conductive one of said devices and to render non-conductive the other of said devices and for supplying the current flowing through said conductive device to the gate winding in circuit therewith, said saturable reactor comprsing core means having a given volt-second characteristic, an electric signal source, means for applying said signal to a first control winding to produce a prescribed frequency from said oscillating means, means in circuit with the output of said power inverter for regulating the output voltage thereof, means in circuit with the outputs of said inverters for generating respective balancing signals which are proportional in magnitude to the difference of the said respective outputs from the average of the output from each inverter, reactive load division biasing means, means for applying said balancing signal as an input to said reactive load division biasing means, means for applying the output of said reactive load division biasing means as input to said voltage regulating means, real load division biasing means, means for applying said balancing signal as an input to said real load division biasing means, means for applying the output of said real load division biasing means as a control signal to a second control winding whereby the frequency of said magnetic coupled multivibrator is controlled by the algebraic sum of said signals in said control windings.

15. In the arrangement defined in claim 14 wherein said magnetic coupled multivibrator further includes rectifier means in circuit with said gate windings to permit current flow through only one of said gate windings when a corresponding one of said devices is conductive.

16. In the arrangement defined in claim 15 wherein said active devices are transistors, said control electrodes and said output electrodes being the bases and collectors of said transistors respectively.

17. In the arrangement defined in claim 15 wherein said means for generating said balancing signals comprises current transformers in circuit with the outputs of said respective power inverters, said transformers comprising cross-connected secondary windings.

18. In the arrangement defined in claim 15 wherein said reactive load biasing means and said real load biasing means are phase discriminators.

References Cited by the Examiner

UNITED STATES PATENTS

| | | | |
|---|---|---|---|
| 2,937,298 | 5/60 | Putkovich et al. | 331—113.1 |
| 2,938,129 | 5/60 | House | 307—88 |
| 2,992,640 | 7/61 | Knapp | 307—88.5 |
| 3,001,082 | 9/61 | Clarke | 307—53 X |

LLOYD McCOLLUM, *Primary Examiner.*

ORIS L. RADER, *Examiner.*